United States Patent [19]

Tanaka et al.

[11] 4,305,042
[45] Dec. 8, 1981

[54] CIRCUIT FOR COMPENSATING FOR DISCONTINUITY OF A NOISE CANCELLED SIGNAL

[75] Inventors: Kouichi Tanaka, Tokyo; Kiyoshi Amazawa, Ohmiya, both of Japan

[73] Assignees: Nippon Electric Co., Ltd.; Clarion Co., Ltd., both of Tokyo, Japan

[21] Appl. No.: 58,402

[22] Filed: Jul. 17, 1979

[30] Foreign Application Priority Data

Jul. 17, 1978 [JP] Japan ................. 53-87345

[51] Int. Cl.³ .................... H03B 1/04; H04B 1/12
[52] U.S. Cl. ..................... 328/162; 328/109; 328/165; 455/223; 455/304
[58] Field of Search ............. 328/165, 162, 109, 163, 328/110, 159; 455/223, 224, 303, 304

[56] References Cited

U.S. PATENT DOCUMENTS

| | | | |
|---|---|---|---|
| 3,231,823 | 1/1966 | Garfield et al. | 328/165 |
| 3,588,705 | 6/1971 | Paine | 455/223 |
| 4,114,105 | 9/1978 | Duncan | 455/223 |
| 4,143,333 | 3/1979 | Jacobsen et al. | 328/165 |
| 4,156,202 | 5/1979 | Takahashi | 328/163 |

*Primary Examiner*—John S. Heyman
*Attorney, Agent, or Firm*—Sughrue, Mion, Zinn, Macpeak and Seas

[57] ABSTRACT

In order to reduce a discontinuity resulting from noise cancellation in an output signal of a noise canceller, particularly in lower-frequency components, a compensator (10) for use in, for example, a radio receiver, comprises two amplifiers (21, 22) for amplifying an input signal in which one or more noise pulses may be superposed. One of the amplifier output signals is given a delay relative to the other. Supplied with a noise detection signal, gates (26, 27) interrupts the amplifier output signals to cancel the noise pulse that substantially simultaneously appears in the both signals. A combination of capacitors (31–33) superposes one of the noise-cancelled signal on the other during presence of the noise pulse to provide an output signal in which the discontinuity is compensated for.

1 Claim, 5 Drawing Figures

CIRCUIT FOR COMPENSATING FOR DISCONTINUITY OF A NOISE CANCELLED SIGNAL

BACKGROUND OF THE INVENTION

This invention relates to a compensator for use in a pulse noise cancelling circuit. The compensator is specifically useful in a radio receiver for an automobile or the like.

In a radio receiver of the type described, a received input signal is inevitably accompanied by noise pulses owing to a signal device, ignition devices, and so on. In order to cancel the noise pulses, a conventional noise pulse cancelling circuit detects the noise pulses to thereby interrupt the received input signal during duration of the each detected noise pulse and to produce an output signal free from the noise pulses. In this cancelling circuit, an interruption takes place in the output signal as a result of suppression of the noise pulse. Alternatively, it is known in the art to retain or hold, during presence of the noise pulse, a level of the input signal just before occurrence of each noise pulse so as to remove the noise pulse. However, discontinuity inevitably occurs in the output signal. Reduction of tone quality results from the discontinuity of the output signal.

It is known that the reduction of tone quality due to the discontinuity is distinctly sensible or audible in a comparatively low frequency band less than about 1 KHz. This means that the reduction of tone quality primarily depends on the discontinuity in the low frequency band.

SUMMARY OF THE INVENTION

It is an object of this invention to provide a compensator which is applicable to a noise pulse cancelling circuit and is capable of reducing discontinuity of an output signal.

It is another object of this invention to provide a compensator of the type described, which is capable of improving tone quality in a comparatively low frequency band.

A compensator to which this invention is applicable is for use in combination with a noise pulse detecting system responsive to an input signal accompanied by a noise pulse for detecting the noise pulse to produce a detection pulse having a predetermined duration. The noise pulse has frequency components higher than the input signal. The compensator is responsive to the input signal and said detection pulse for compensating for the noise pulse to produce an output signal exempted from the noise pulse. According to this invention, the compensator comprises first means responsive to the input signal for producing a first phase signal having a first phase predetermined in relation to the input signal, second means for delaying the input signal to produce a second phase signal having a second phase delayed relative to the first phase, the noise pulse delayed by the second means substantially falling within the predetermined duration, third means for interrupting the first phase signal during the predetermined duration to produce a first intermittent signal which is continuous except the predetermined duration, fourth means for interrupting the second phase signal during the predetermined duration to produce a second intermittent signal which is continuous except the predetermined duration, fifth means for producing a preselected one of the first and the second intermittent signals as the output signal during absence of the detection pulse and a superposition of the other of the first and the second intermittent signals on the preselected one intermittent signal as the output signal during presence of the detection pulse.

DESCRIPTION OF THE PREFERRED EMBODIMENTS

Figure 1:
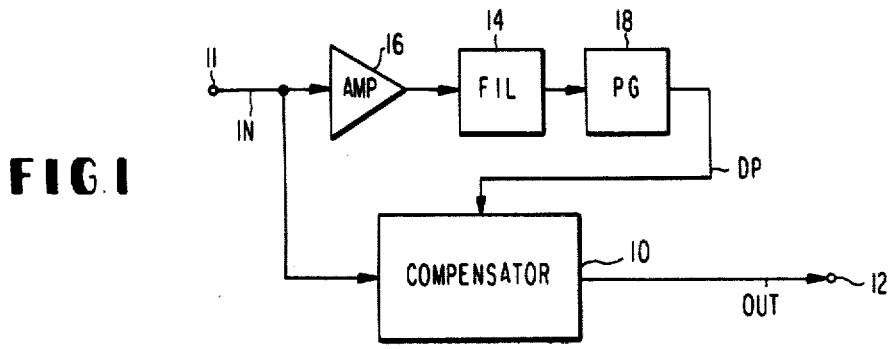
FIG. 1 is a block diagram of a noise pulse cancelling system comprising a compensator according to this invention.

Referring to FIG. 1, description will be made of a noise pulse cancelling system comprising a compensator 10 according to this invention. The system has an input terminal 11 for an input signal IN of an audio frequency band accompanied by one or more noise pulses and an output terminal 12 for an output signal OUT, which is exempted from or in which the noise pulses are compensated for. The input signal IN falls within a frequency band less than 7.5 kHz in this example and is delivered together with the noise pulses mainly to the compensator 10 (to be described later in detail) and partially to a high pass filter 14 through an amplifier 16. Inasmuch as the noise pulses include high frequency components in comparison with the input signal, the filter 14 detects the noise pulses and supplies the detected noise pulses to a pulse generator 18. For example, the filter 14 may have a pass band between 15 kHz and 60 kHz. Energized by each of the noise pulses detected by the filter 14, the pulse generator 18 supplies the compensator 10 with a detection pulse DP which is indicative of presence of the noise pulses and lasts during a predetermined duration of, for example, about 0.3 millisecond. The duration may be equal to a period of a single noise pulse or somewhat longer than the single noise pulse. The pulse generator 18 may be a monostable multivibrator which is capable of continuously producing the detection pulse DP when the noise pulses successively appear during the predetermined duration. As is mentioned above, the amplifier 16, the filter 14, and the pulse generator 18 serves as a detection circuit for detecting the noise pulses.

Figure 2:
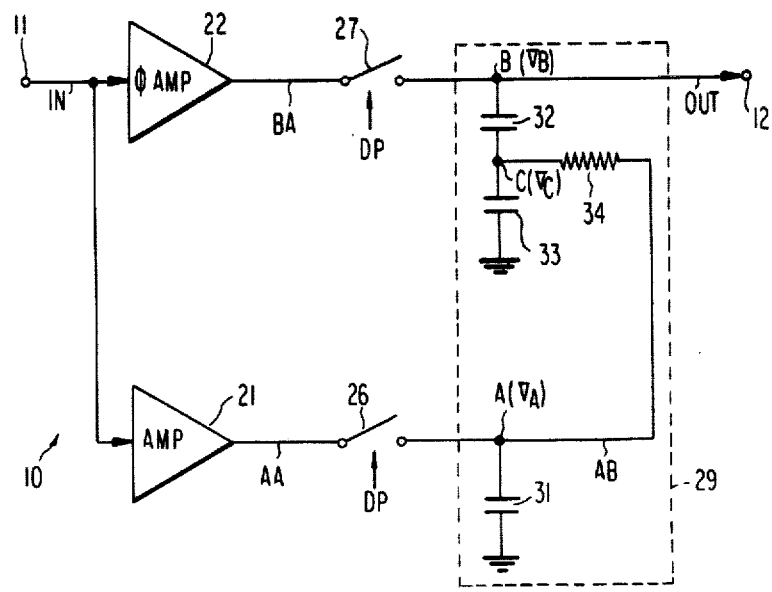
FIG. 2 is a circuit diagram of a compensator according to an embodiment of this invention.

Referring now to FIG. 2, a compensator 10 according to a first embodiment of this invention is connected to the input and the output terminals 11 and 12 depicted also in FIG. 1. The compensator 10 is for cancelling the noise pulses to compensate for discontinuity resulting from noise cancellation and comprises first and second amplifiers 21 and 22 to which the input signal IN is delivered through the input terminal 11. The first amplifier 21 produces a first phase signal AA which is in phase relative to the input signal IN. Practically, use is made of the first amplifier 21 having a gain equal to about 2 (6 dB). On the other hand, the second amplifier 22 produces a second phase signal BA having a second phase delayed relative to the input signal IN and to the first phase signal AA. The second amplifier 22, therefore, serves to delay the input signal IN together with the noise pulses. It is presumed here that the first and the second amplifiers 21 and 22 have output impedances sufficiently or negligibly low.

Figure 3:
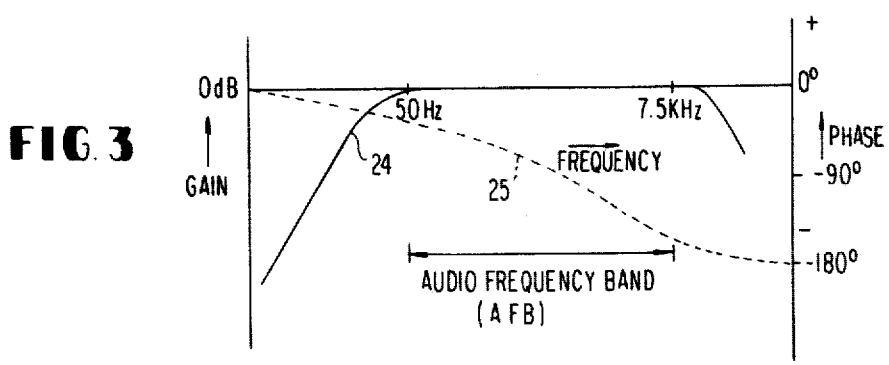
FIG. 3 is a graphical representation of characteristics of one of a plurality of amplifiers used in the compensator according to the embodiment.

Temporarily referring to FIG. 3, the second amplifier 22 typically has a frequency versus gain characteristic illustrated by a curve 24. From this curve 24, it is readily understood that the second amplifier 22 has a gain equal to unity (0 dB) in an audio frequency band AFB. Therefore, the gain of the second amplifier 22 is half as large as that of the first amplifier 21. Furthermore, the second amplifier 22 has a frequency versus phase characteristic illustrated by a curve 25 gradually descending as the frequency increases. This shows that a higher frequency portion of the audio frequency band AFB is more delayed in phase than a lower frequency portion thereof and compensation is favorably made within a frequency range between 50 Hz and 3 kHz.

Referring to FIG. 2 again and FIG. 4 afresh, the compensator 10 comprises first and second gate circuits 26 and 27 connected to the first and the second amplifiers 21 and 22, respectively, and simultaneously controlled by the detection pulse DP described with reference to FIG. 1. In the absence of the detection pulse DP, the gate circuits 26 and 27 are enabled to cause the first and the second phase signals AA and BA to pass therethrough to produce gate output signals that will be called first and second intermittent signals AB and BB. The input signal IN and the first intermittent signal AB lead the second intermittent signal BB in phase as exemplified in FIG. 4. Let a noise pulse NP be superimposed on the input signal IN. When supplied with the detection pulse DP resulting from the noise pulse NP, the gate circuits 26 and 27 are simultaneously disabled to interrupt the noise signal NP both in the first and the second intermittent signals AB and BB.

Referring more specifically to FIGS. 2 and 4, it should again be mentioned that the noise pulse NP consists of frequency components that are considerably higher in frequency than the input signal IN. Consequently, the noise pulse NP in the second phase signal BA is not appreciably delayed as compared with that in the first phase signal AA and appears substantially within the above-mentioned duration of the detection pulse DP. The first and the second intermittent signals AB and BB are continuous except for the duration of the detection pulse DP, in which duration the intermittent signals AB and BB become discontinuous.

Figure 4:
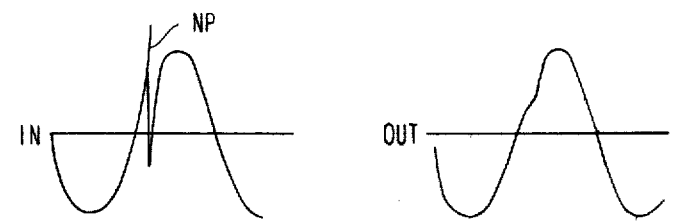
FIG. 4 is a time chart for describing the operation of the compensator shown in FIG. 2.
Figure 4:
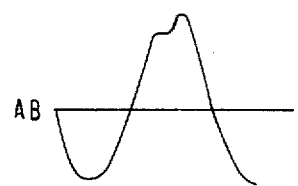
Figure 4:
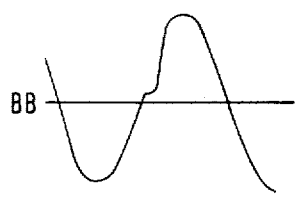

Further referring to FIGS. 2 and 4, the compensator 10 comprises an intermediate circuit 29 responsive to the first and the second intermittent signals AB and BB for supplying the output terminal 12 with an output signal OUT in which the noise pulse NP is compensated for, with the discontinuity reduced to a minimum in the output signal OUT. More particularly, the intermediate circuit 29 produces the second intermittent signal BB per se as the output signal during absence of the detection pulse DP or during an interval of time in which the first and the second gate circuits 26 and 27 are kept enabled. On the other hand, the intermediate circuit 29 produces, as the output signal OUT, a superposition of the first intermittent signal AB on the second intermittent signal BB during presence of the detection pulse DP or during the interval in which the first and the second gate circuits 26 and 27 are disabled.

In the example illustrated in FIG. 2, the intermediate circuit 29 comprises a first capacitor 31 between a first point A for receiving the first intermittent signal AB and ground. The circuit 29 comprises a series connection of second and third capacitors 32 and 33 between a second point B for receiving the second intermittent signal BB and ground. The circuit 29 further comprises a resistor 34 between the first point A and a point C of connection between the second and the third capacitors 32 and 33. The output terminal 12 is connected to the second point B. Herein, the first through the third capacitors 31 to 33 are of the same capacity between 0.01 and 0.1 microfarad and the resistor 34 is of scores of kiloohms, specifically, about 30 kiloohms. It is mentioned here that the output terminal 12 is practically connected to an amplifier (not shown) having a high input impedance of, for example, several megaohms. An impedance between the output terminal 12 and ground is considerably high during presence of the detection pulse DP. The first and the second intermittent signals AB and BB appear as first and second voltages $V_A$ and $V_B$ at the first and the second points A and B, respectively. On the condition such that the gain of the first amplifier 21 is about twice as high as that of the second amplifier 22 and that the resistor 34 is of about 30 kiloohms, it has experimentally be confirmed that a third voltage $V_C$ developed at the point C of connection is favorably correlative with the first voltage $V_A$ of the first point A and lags behind the first voltage $V_A$.

Specifically referring to FIG. 4, let the noise pulse NP be superposed on the input signal IN during an ascending period thereof. Under the circumstances, the voltage $V_A$ rises up faster than the voltage $V_C$, as will readily be understood from the first and the second intermittent signals AB and BB. When the gate circuits 26 and 27 are disabled, the intermediate circuit 29 is isolated from the first and the second amplifiers 21 and 22. As a result, electric charges accumulated on the first capacitor 31 flow into third capacitor 33 through the resistor 34. When the first and the second gate circuits 26 and 27 are enabled after the lapse of the predetermined duration, the second intermittent signal BB alone is supplied as the output signal OUT to the output terminal 12 without the first phase signal AB. This is because the first and the second amplifiers 26 and 27 have low output impedances as described before and the resistor 34 is connected between the first point A and the point C of connection. Thus, the second voltage $V_B$ continuously rises up and appears at the output terminal 12 as the output signal OUT which compensates for or allay the discontinuity of the second phase signal BB.

When a noise pulse Np is intermingled in the input signal IN during a descending period thereof, electric charges accumulated on the third capacitor 33 flow into the first capacitor 31 while the gate circuits 26 and 27 are disabled. This is because the third voltage $V_C$ is higher than the first voltage $V_A$. Consequently, the second voltage $V_B$ is gradually reduced to compensate for the discontinuity of the second phase signal BB. The output signal OUT is no more accompanied by the noise pulse NP and substantially continuous.

In the example illustrated with reference to FIG. 2, the second and the third capacitors 32 and 33 are of the substantially same capacitance. The point of connection C to which the resistor 34 is connected, is therefore a point of bisection between the second point B and ground. In consideration of this, it is preferred that the gain of the first amplifier 21 is twice as high as that of the second amplifier 22. This is not always necessary. For example, the second point B may be directly connected to the "third" capacitor 33 with the second capacitor 32 removed. In this event, it is preferable to make the amplifier 21 and 22 have a substantially equal gain. It is thus possible to optionally select the gains of the respective amplifiers 21 and 22.

Figure 5:
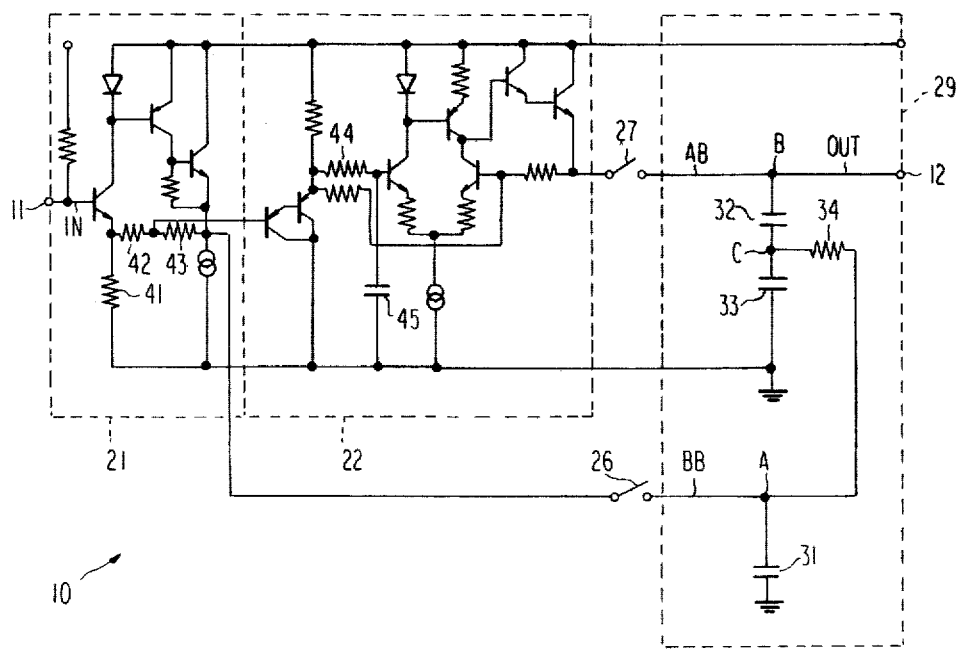
FIG. 5 is a circuit diagram of a compensator according to a more specific embodiment of this invention.

Referring to FIG. 5, a compensator according to a specific embodiment of this invention comprises similar parts illustrated with reference to FIG. 2 and designated by like reference numerals. The first amplifier 21 connected to the input terminal 11 comprises three transistors and three resistors 41, 42, and 43 to produce a first phase signal inphase relative to an input signal IN. An intermediate point between the resistors 42 and 43 is connected to the second amplifier 22. These resistors 41, 42, and 43 are for defining the respective gains of the first and the second amplifiers 21 and 22. The second amplifier 22 comprises a resistor 44 and a capacitor 45 to favorably delay the input signal IN in a low frequency band and, as a result, to produce a second phase signal having a second phase delayed relative to the first phase signal. It is possible with the compensator to produce an output signal exempted from the discontinuity caused by cancelling operation of the pulse noise.

It may be mentioned here that the compensation effected for one or more noise pulses by a compensator 10 according to this invention is valid only in a lower frequency band, such as between 1 and 3 kHz. The compensation is ineffective in a higher frequency band. This shows that the compensator 10 serves as a holding circuit as regards each of the first and the second intermittent signals AB and BB for holding, during the predetermined duration of the detection pulse DP, the level of the intermittent signal prior to occurrence of the noise pulse NP. Either of the intermittent signals AB and BB, however, is not supplied to the output terminal 12. The slope of the output signal OUT is rendered continuous. Although nevertheless present in the output signal OUT, the discontinuity in the higher frequency band does not objectionally adversely affect the tone quality. This is because the tone is determinated mainly by the discontinuity in lower frequencies.

While this invention has so far been described in conjunction with a few preferred embodiments thereof, it is readily possible for those skilled in the art to put the invention into practice in various manners. For example, the first phase signal AB may be derived from the output terminal 12 instead of the second phase signal BB. The resistor 34 may be decided on the basis of the capacities of the first through third capacitors 31 to 33, the output impedances of the first and the second amplifiers 21 and 22, an input impedance of an amplifier to be connected to the output terminal 12, and so on. The first through third capacitors 31 to 33 may be different in capacities from one another.

What is claimed is:

1. A compensator for use in combination with a noise pulse detecting system responsive to an input signal including a noise pulse for detecting said noise pulse to produce a detection pulse having a predetermined duration, said noise pulse having frequency components higher than said input signal, said compensator being responsive to said input signal and said detection pulse for compensating for said noise pulse to produce an output signal exempted from said noise pulse, wherein the improvement comprises:

first means responsive to said input signal for producing a first phase signal having a first phase predetermined in relation to said input signal and including said noise pulse with said first phase;

second means responsive to said input signal for delaying said input signal to produce a second phase signal having a second phase delayed relative to said first phase and including the noise pulse with said second phase, the noise pulse having said second phase substantially falling within said predetermined duration;

third means responsive to said detection pulse and connected to said first means for interrupting said first phase signal during said predetermined duration to produce a first intermittent signal which is continuous except said predetermined duration and from which the noise pulse having said first phase is substantially cancelled;

fourth means responsive to said detection pulse and connected to said second means for interrupting said second phase signal during said predetermined duration to produce a second intermittent signal which is continuous except said predetermined duration and from which the noise pulse having said second phase is substantially cancelled; and fifth means connected to said third and said fourth means for separately holding said first and said second intermittent signals and for producing a preselected one of said first and said second signals with the other of said first and said second intermittent signals superposed on said preselected one of the first and the second intermittent signals during the time that said preselected one of the first and the second intermittent signals is interrupted.

* * * * *